United States Patent
Tanaka et al.

(10) Patent No.: US 9,918,289 B2
(45) Date of Patent: *Mar. 13, 2018

(54) POWER AMPLIFICATION MODULE FOR MULTIPLE BANDS AND MULTIPLE STANDARDS

(71) Applicant: Murata Manufacturing Co., Ltd., Kyoto (JP)

(72) Inventors: Satoshi Tanaka, Kyoto (JP); Takayuki Tsutsui, Kyoto (JP); Yusuke Tanaka, Kyoto (JP); Hayato Nakamura, Kyoto (JP); Kazuhito Nakai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/451,490

(22) Filed: Mar. 7, 2017

(65) Prior Publication Data

US 2017/0181108 A1   Jun. 22, 2017

Related U.S. Application Data

(63) Continuation of application No. 15/082,567, filed on Mar. 28, 2016, now Pat. No. 9,642,103.

(30) Foreign Application Priority Data

Jun. 23, 2015 (JP) ................. 2015-125868

(51) Int. Cl.
*H04B 7/212* (2006.01)
*H04W 52/52* (2009.01)
(Continued)

(52) U.S. Cl.
CPC .......... *H04W 52/52* (2013.01); *H03F 1/0261* (2013.01); *H03F 3/195* (2013.01);
(Continued)

(58) Field of Classification Search
None
See application file for complete search history.

(56) References Cited

U.S. PATENT DOCUMENTS

| 2014/0235184 A1 | 8/2014 | Ichitsubo et al. |
| 2015/0340991 A1* | 11/2015 | Lin ............... H03F 1/0205 455/127.1 |
| 2016/0181995 A1* | 6/2016 | Nentwig .......... H03F 3/211 330/295 |

OTHER PUBLICATIONS

TriQunit Corp., TQM7M9050 data sheet, Revision G, Jun. 2014.

* cited by examiner

*Primary Examiner* — Bob Phunkulh
(74) *Attorney, Agent, or Firm* — Pearne & Gordon LLP

(57) ABSTRACT

Provided is a communication unit that includes first and second power-amplification modules, which can be integrated. The first power-amplification module includes a first power-amplifier for a first frequency band in a first communication scheme, a second power-amplifier for a second frequency band in the first communication scheme, a third power-amplifier for a third frequency band in a second communication scheme, a fourth power-amplifier for a fourth frequency band in the second communication scheme, a first bias circuit that generates a first bias current to the first and second power-amplifiers, and a bias current circuit that converts the first bias current into a second bias current to the third and fourth power-amplifiers. The second power-amplification module includes a fifth power-amplifier for a fifth frequency band in the first communication scheme, and a second bias circuit that generates a third bias current to the fifth power-amplifier.

12 Claims, 8 Drawing Sheets

(51) Int. Cl.

| | |
|---|---|
| *H04L 5/14* | (2006.01) |
| *H04B 7/26* | (2006.01) |
| *H03F 3/195* | (2006.01) |
| *H03F 3/24* | (2006.01) |
| *H03F 3/68* | (2006.01) |
| *H03F 1/02* | (2006.01) |
| *H04W 72/04* | (2009.01) |
| *H04W 88/06* | (2009.01) |

(52) U.S. Cl.
CPC ............... *H03F 3/245* (2013.01); *H03F 3/68* (2013.01); *H04B 7/265* (2013.01); *H04L 5/14* (2013.01); *H04W 72/042* (2013.01); *H03F 2200/111* (2013.01); *H04W 88/06* (2013.01)

FIG. 2
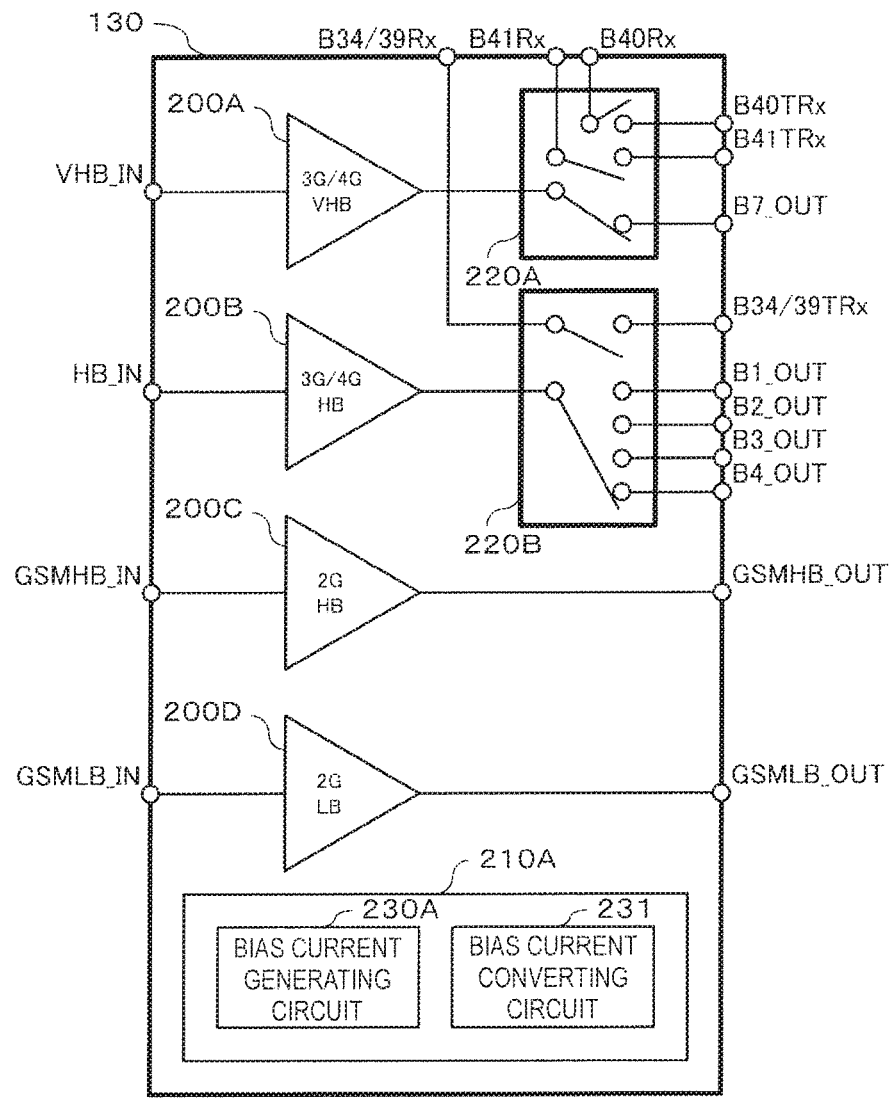
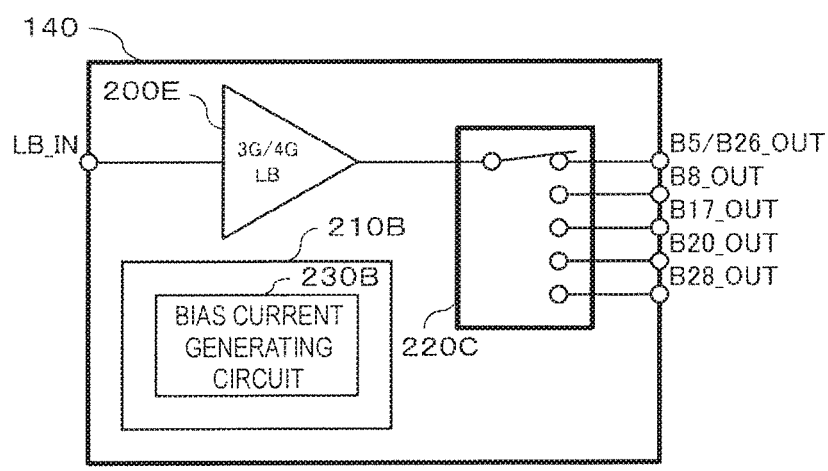

FIG. 5

| BAND (DLCA) | UL | AFFECTED DL |
|---|---|---|
| B6 B7 | B6 (LB) | B7 (VHB) |
| B20 B38 | B20 (LB) | B38 (VHB) |
| B4 B17 | B17 (LB) | B4 (HB) |
| B4 B5 | B4 (HB) | B5 (LB) |
| B4 B5 B30 | B4 (HB) | B5 (LB) |
| B2 B4 B5 | B4 (HB) | B5 (LB) |
| B3 B5 | B3 (HB) | B5 (LB) |
| B3 B8 | B8 (LB) | B3 (HB) |
| B1 B3 B5 | B3 (HB) | B5 (LB) |
| B1 B3 B8 | B8 (LB) | B3 (HB) |
| B3 B8 | B8 (LB) | B3 (HB) |
| B1 B28 | B28 (LB) | B1 (HB) |
| B3 B19 | B3 (HB) | B19 (LB) |

POWER AMPLIFICATION MODULE FOR MULTIPLE BANDS AND MULTIPLE STANDARDS

This is a continuation of U.S. application Ser. No. 15/082,567 filed on Mar. 28, 2016 which claims priority from Japanese Patent Application No. 2015-125868 filed on Jun. 23, 2015. The contents of these applications are incorporated herein by reference in their entireties.

BACKGROUND OF THE DISCLOSURE

Field of the Disclosure

The present disclosure relates to a communication unit.

Description of the Related Art

A communication unit that includes a power amplification module for amplifying the power of a radio frequency (RF) signal that is to be transmitted to a base station is employed in a portable terminal that utilizes a cellular phone communication network. In recent years, the number of users of portable terminals has increased tremendously and the number of frequency bands utilized by cellular phones has increased in order to handle the communication traffic created by these users. Therefore, it is required that portable terminals support these frequency bands.

In addition, from the viewpoints of design restrictions, profile reduction and size reduction of portable terminals, it is required that such communication units be reduced in size. Accordingly, for example, a power amplification module is used in which a plurality of power amplifiers, which support a plurality of communication schemes (modes) and a plurality of frequency bands, are integrated into a single module, as described in "TQM7M9050 data sheet", TriQuint Corp., (online), web address: www.triquint.com/products/d/DOC-B-00000332.

The power amplification module disclosed in "TQM7M9050 data sheet", TriQuint Corp., (online), web address: www.triquint.com/products/d/DOC-B-00000332 supports the second generation mobile communication system (2G) and the third/fourth generation mobile communication system (3G/4G). This power amplification module includes a power amplifier for a low frequency band (LB) that is a 1 GHz band of the global system for mobile communications (GSM) (registered trademark), which is the 2G communication standard, a power amplifier for a high frequency band (HB) that is a 2 GHz band of GSM, a power amplifier for an LB that is a 1 GHz band of 3G/4G and a power amplifier for an HB that is a 2 GHz band of 3G/4G.

In this power amplification module, the 3G/4G LB power amplifier covers two frequency bands that are band 5 (B5: transmission frequency band of 824 MHz to 849 MHz) and band 8 (B8: transmission frequency band of 880 MHz to 915 MHz). In addition, the 3G/4G HB power amplifier covers four frequency bands that are band 1 (B1: transmission frequency band of 1920 MHz to 1980 MHz), band 2 (B2: transmission frequency band of 1850 MHz to 1910 MHz), band 3 (B3: transmission frequency band of 1710 MHz to 1785 MHz) and band 4 (B4: transmission frequency band of 1710 MHz to 1755 MHz).

In recent years, as a technique for improving the downlink communication speed from a base station to a portable terminal, downlink carrier aggregation (hereafter, "DLCA"), which is a technique in which a plurality of frequency bands are simultaneously used in the downlink has been focused upon in long term evolution (LTE) advanced, which is a 4G communication standard. Consequently, a communication unit that is suitable for downlink carrier aggregation has been demanded.

BRIEF SUMMARY OF THE DISCLOSURE

The present disclosure has been made in light of the above-described circumstances and it is an object thereof to provide a multi-mode multi-band communication unit that is suitable for downlink carrier aggregation.

A communication unit according to a preferred embodiment of the present disclosure includes first and second power amplification modules that are each integrated so as to be separate from each other. The first power amplification module includes a first power amplifier that amplifies a first transmission signal of first frequency band in a first communication scheme, a second power amplifier that amplifies a second transmission signal of a second frequency band, which is lower than the first frequency band, in the first communication scheme, a third power amplifier that amplifies a third transmission signal of a third frequency band in a second communication scheme, a fourth power amplifier that amplifies a fourth transmission signal of a fourth frequency band, which is lower than the third frequency band, in the second communication scheme, a first bias current generating circuit that generates a first bias current to be supplied to the first and second power amplifiers, and a bias current converting circuit that converts the first bias current into a second bias current to be supplied to the third and fourth power amplifiers. The second power amplification module includes a fifth power amplifier that amplifies a fifth transmission signal of a fifth frequency band, which is lower than the second frequency band, in the first communication scheme, and a second bias current generating circuit that generates a third bias current to be supplied to the fifth power amplifier.

According to the preferred embodiment of the present disclosure, a multi-mode multi-band communication unit that is suitable for downlink carrier aggregation is provided.

Other features, elements, characteristics and advantages of the present disclosure will become more apparent from the following detailed description of preferred embodiments of the present disclosure with reference to the attached drawings.

BRIEF DESCRIPTION THE SEVERAL VIEWS OF THE DRAWINGS

FIG. 2 illustrates an example of the configurations of power amplification modules;

Figure 6:
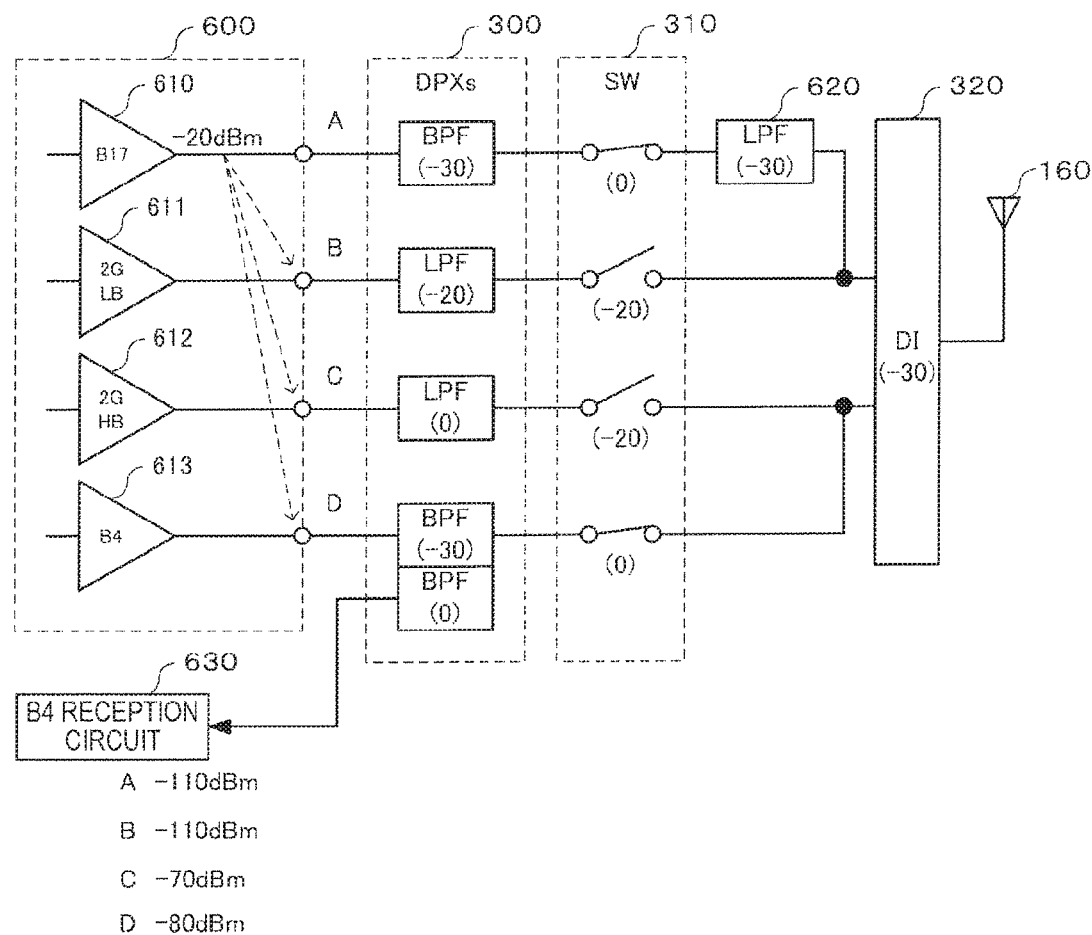
Figure 7:
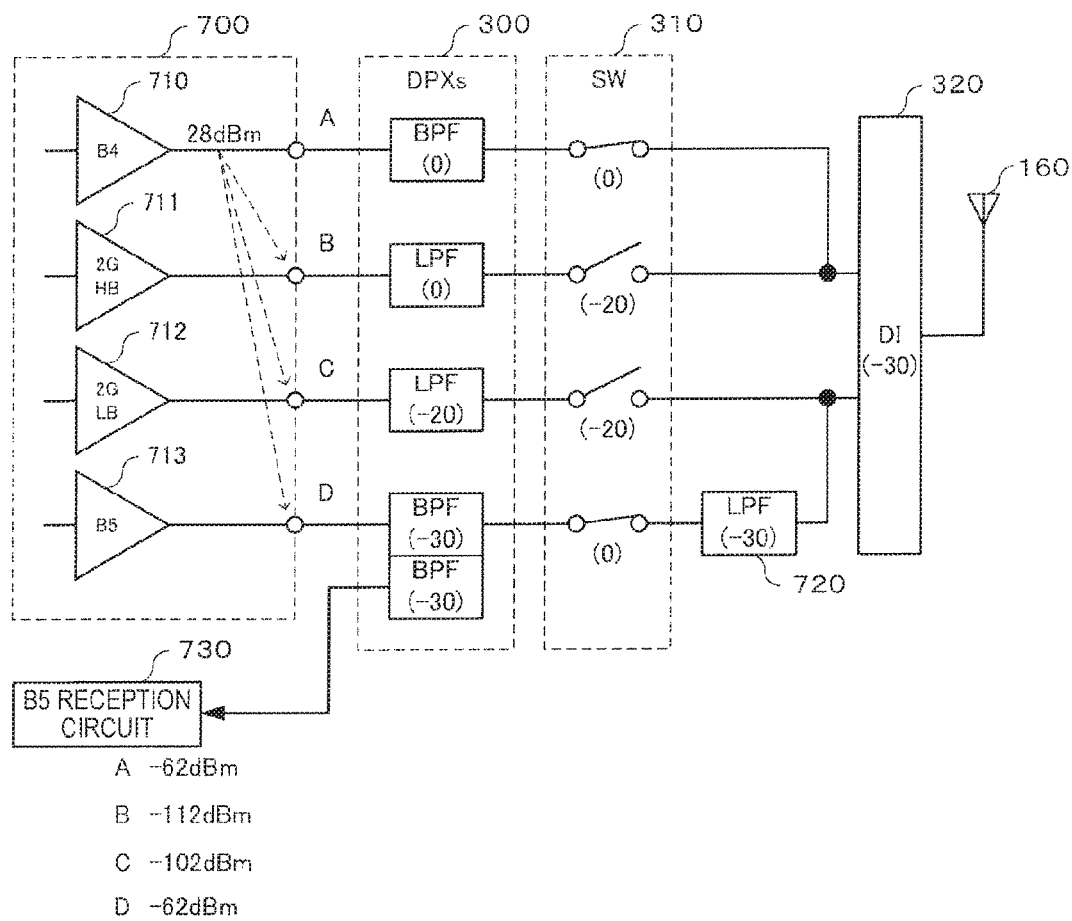

FIG. 5 lists combinations of frequency bands where a reception signal experiences interference from a transmission signal in DLCA;

FIG. 6 illustrates an example configuration of a transmission unit for explaining the effect of coupling between terminals of a power amplification module; and FIG. 7 illustrates another example configuration of a transmission unit for explaining the effect of coupling between terminals of a power amplification module.

DETAILED DESCRIPTION OF THE DISCLOSURE

Figure 1:
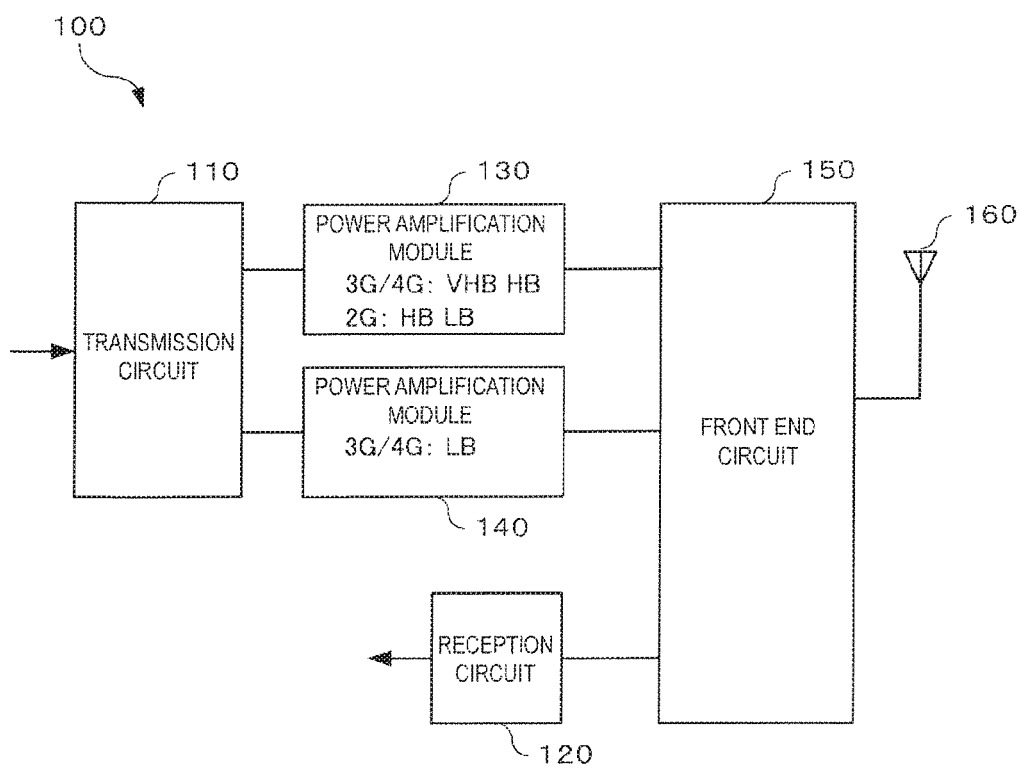
FIG. 1 illustrates an example configuration of a communication unit according to an embodiment of the present disclosure.

Hereafter, an embodiment of the present disclosure will be described while referring to the drawings. FIG. 1 illustrates an example configuration of a communication unit 100 according to an embodiment of the present disclosure. The communication unit 100 is for example used to perform transmission and reception, in a mobile communication device such as a cellular phone, of various signals such as speech and data to and from a base station. The communication unit 100 supports a plurality of communication schemes (multiple modes). Specifically, the communication unit 100 supports 3G/4G (first communication scheme) and 2G (second communication scheme). In addition, the communication unit 100 supports a plurality of frequency bands (multiple bands) among radio frequencies (RF). Furthermore, the communication unit 100 supports DLCA.

As illustrated in FIG. 1, the communication unit 100 includes a transmission circuit 110, a reception circuit 120, power amplification modules 130 and 140, a front end circuit 150 and an antenna 160.

The transmission circuit 110 modulates an input signal such as speech or data on the basis of a modulation scheme such as LTE or GSM and outputs an RF signal in order to perform wireless transmission. The transmission circuit 110 can include a plurality of transmission circuits in accordance with the modulation schemes and frequency bands used.

The reception circuit 120 receives a reception signal (RF signal) output from the front end circuit 150, demodulates the reception signal and outputs the demodulated reception signal. The reception circuit 120 can include a plurality of reception circuits in accordance with the modulation schemes and frequency bands.

The power amplification modules 130 and 140 each amplify the power of an input RF signal up to the level that is required to transmit the RF signal to the base station and then output the amplified signal. The power amplification module 130 (first power amplification module) amplifies RF signals of a 3G/4G 2.5 GHz band (very high band (VHB)), a 3G/4G 2 GHz band (high band (HB)), a 2G 2 GHz band (high band (HB)) and a 2G 1 GHz band (low band (LB)). In addition, the power amplification module 140 (second power amplification module) amplifies RF signals of a 3G/4G 1 GHz band (low band (LB)). The power amplification modules 130 and 140 will be described in detail later.

The front end circuit 150 switches the paths of transmission signals and reception signals, performs filtering processing and so forth. The front end circuit 150 will be described in detail later.

FIG. 2 illustrates an example of the configurations of the power amplification modules 130 and 140. The power amplification modules 130 and 140 have each been integrated as a single module.

The power amplification module 130 includes power amplifiers 200A, 200B, 200C and 200D, a bias circuit 210A and switch circuits 220A and 220B.

The power amplifier 200A (first power amplifier) amplifies and then outputs an RF signal (first transmission signal) input from a terminal VHB_IN. The power amplifier 200A supports a 3G/4G 2.5 GHz band (VHB) (first frequency band). Specifically, the power amplifier 200A supports band 7 (B7: transmission frequency band of 2500 to 2570 MHz). In addition, the power amplifier 200A supports band 40 (B40: transmission frequency band of 2300 to 2400 MHz) and band 41 (B41: transmission frequency band 2496 to 2690 MHz) (first frequency band) used in a time division duplexing (TDD) communication scheme. The frequency bands given here are examples and the frequency bands supported by the power amplifier 200A are not limited to these frequency bands.

The power amplifier 200B (second power amplifier) amplifies and then outputs an RF signal (second transmission signal) input from a terminal HB_IN. The power amplifier 200B supports a 3G/4G 2 GHz band (HB) (second frequency band). Specifically, the power amplifier 200B supports band 1 (B1: transmission frequency band of 1920 to 1980 MHz), band 2 (B2: transmission frequency band of 1850 to 1910 MHz), band 3 (B3: transmission frequency band of 1710 to 1785 MHz) and band 4 (B4: transmission frequency band of 1710 to 1755 MHz). In addition, the power amplifier 200B supports band 34 (B34: transmission frequency band of 2010 to 2025 MHz) and band 39 (B39: transmission frequency band of 1880 to 1920 MHz) (second frequency band) used in a TDD communication scheme. The frequency bands given here are examples and the frequency bands supported by the power amplifier 200B are not limited to these frequency bands.

The power amplifier 200C (third power amplifier) amplifies an RF signal (third transmission signal) input from a terminal GSMHB_IN and then outputs the amplified signal from a terminal GSMHB_OUT. The power amplifier 200C supports a 2G GSM 2 GHz band (HB) (third frequency band).

The power amplifier 200D (fourth power amplifier) amplifies an RF signal (fourth transmission signal) input from a terminal GSMLB_IN and then outputs the amplified signal from a terminal GSMLB_OUT. The power amplifier 200D supports a 2G GSM 1 GHz band (LB) (fourth frequency band).

The power amplifiers 200A, 200B, 200C and 200D may be each formed of a plurality of stages. For example, the power amplifiers 200A and 200B can each have a two-stage configuration. In addition, the power amplifiers 200C and 200D can each have a three-stage configuration, for example.

The bias circuit 210A supplies a bias current having a level corresponding to a bias control signal, which is input from the outside, to the power amplifiers 200A, 200B, 200C and 200D. The bias circuit 210A includes a bias current generating circuit 230A and a bias current converting circuit 231. The bias current generating circuit 230A (first bias current generating circuit) generates a bias current for the 3G/4G power amplifiers 200A and 200B (first bias current). The bias current generating circuit 230A, for example, includes a plurality of current sources having different current levels and is able to generate a bias current by combining the currents from these current sources in accordance with the bias control signal. The bias current converting circuit 231 converts the 3G/4G bias current generated by the bias current generating circuit 230A into a 2G bias current (second bias current) and supplies the 2G bias current to the 2G power amplifiers 200C and 200D.

The switch circuits 220A and 220B switch a signal path in accordance with a switch control signal input from the outside.

Specifically, the switch circuit 220A (first switch circuit) is able to output a signal output from the power amplifier 200A to a terminal B7_OUT, a terminal B40TRx or a terminal B41TRx. The terminal B7_OUT is a terminal for outputting a band 7 signal. In addition, the terminal B40TRx and the terminal B41TRx (first transmission/reception terminals) are terminals for respectively inputting and outputting a band 40 signal and a band 41 signal.

Furthermore, the switch circuit 220A is able to respectively output signals input from the terminal B40TRx and the terminal B41TRx to a terminal B40Rx and a terminal B41Rx. The terminal B40Rx and the terminal B41Rx (first output terminals) are terminals that are connected to a reception circuit 120 for band 40 and band 41 (first reception circuit).

The switch circuit 220B (second switch circuit) is able to output a signal output from the power amplifier 200B to a terminal B1_OUT, a terminal B2_OUT, a terminal B3_OUT, a terminal B4_OUT or a terminal B34/39TRx. The terminal B1_OUT, the terminal B2_OUT, the terminal B3_OUT and the terminal B4_OUT are terminals for outputting band 1, band 2, band 3 and band 4 signals, respectively. Furthermore, the terminal B34/39TRx (second transmission/reception terminal) is a terminal for inputting and outputting band 34 and band 39 signals.

In addition, the switch circuit 220B is able to output a signal input from the terminal B34/39TRx to a terminal B34/39Rx. The terminal B34/39Rx (second output terminal) is a terminal that is connected to a reception circuit 120 for band 34 and band 39 (second reception circuit).

The power amplification module 140 includes a power amplifier 200E, a bias circuit 210B and a switch circuit 220C.

The power amplifier 200E amplifies and then outputs an RF signal input from a terminal LB_IN. The power amplifier 200E supports a 3G/4G 1 GHz band (LB). Specifically, the power amplifier 200E supports band 5 (B5: transmission frequency band of 824 to 849 MHz), band 8 (B8: transmission frequency band of 880 to 915 MHz), band 17 (B17: transmission frequency band of 704 to 716 MHz), band 20 (B20: transmission frequency band of 832 to 862 MHz), band 26 (B26: transmission frequency band of 814 to 849 MHz) and band 28 (B28: transmission frequency band of 700 to 748 MHz). The frequency bands given here are examples and the frequency bands supported by the power amplifier 200E are not limited to these frequency bands.

The power amplifier 200E may be formed of a plurality of stages. For example, the power amplifier 200E can have a two-stage configuration.

Similarly to the bias circuit 210A, the bias circuit 210B supplies to the power amplifier 200E a bias current having a level corresponding to a bias control signal input from the outside. The bias circuit 210B includes a bias current generating circuit 230B. The bias current generating circuit 230B generates a bias current for the 3G/4G power amplifier 200E. Since the power amplification module 140 does not include a 2G power amplifier, the bias circuit 210B is not provided with a circuit for converting a 3G/4G bias current into a 2G bias current.

The switch circuit 220C switches a signal path in accordance with a switch control signal input from the outside. Specifically, the switch circuit 220C is able to output a signal output from the power amplifier 200E to a terminal B5/B26_OUT, a terminal B8_OUT, a terminal B17_OUT, a terminal B20_OUT or a terminal B28_OUT. The terminal B5/B26_OUT, the terminal B8_OUT, the terminal B17_OUT, the terminal B20_OUT and the terminal B28_OUT are terminals for outputting band 5/band 26, band 8, band 17, band 20 and band 28 signals, respectively.

Figure 3:
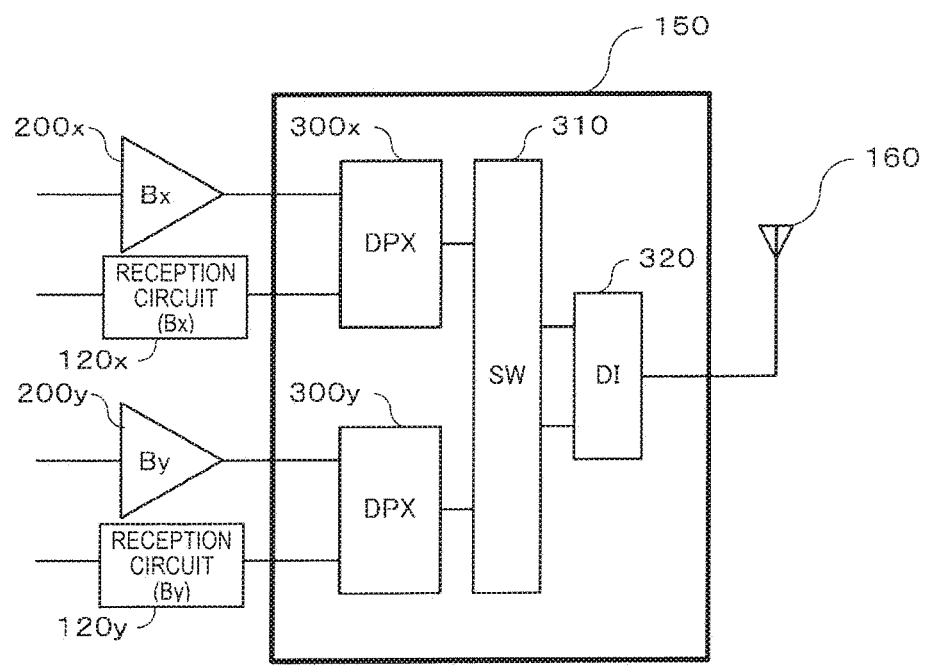
FIG. 3 illustrates an example of the configuration of a front end circuit.

FIG. 3 illustrates an example of the configuration of the front end circuit 150. As illustrated in FIG. 3, the front end circuit 150 includes duplexers 300 (300$x$ and 300$y$), a switch circuit 310 and a diplexer 320.

Two power amplifiers 200$x$ and 200$y$ and two reception circuits 120$x$ and 120$y$ are illustrated in FIG. 3. The power amplifier 200$x$ and the reception circuit 120$x$ support a band x (Bx). The power amplifier 200$y$ and the reception circuit 120$y$ support a band y (By).

The duplexer 300$x$ supports band x. The duplexer 300$x$ outputs to the switch circuit 310 a transmission signal of band x output from the power amplifier 200$x$. In addition, the duplexer 300$x$ outputs to the reception circuit 120$x$ a reception signal of band x output from the switch circuit 310. The duplexer 300$x$ is for example formed using a low pass filter (LPF), a band pass filter (BPF) or the like.

The duplexer 300$y$ supports band y. The duplexer 300$y$ outputs to the switch circuit 310 a transmission signal of band y output from the power amplifier 200$y$. In addition, the duplexer 300$y$ outputs to the reception circuit 120$y$ a reception signal of band y output from the switch circuit 310. The duplexer 300$y$ is for example formed using a low pass filter (LPF), a band pass filter (BPF) or the like.

The switch circuit 310 switches a signal path between the diplexer 320 and the duplexers 300$x$ and 300$y$ in accordance with the frequency band of a transmission or reception signal.

The diplexer 320 divides a reception signal from the antenna 160 into reception signals of the respective frequency bands and combines transmission signals of a plurality of frequency bands. The diplexer 320 is for example formed using a low pass filter (LPF), a high pass filter (HPF) or the like.

Although a circuit that supports two frequency bands is illustrated in FIG. 3 in order to simplify the description, the configuration of the communication unit 100 is not limited to this. In addition, the front end circuit 150 may include other filter circuits and so forth in accordance with the supported frequency bands.

Next, description will be given of signal interference inside the communication unit 100 in the case where DLCA is performed.

First, the principle behind signal interference in DLCA will be described.

Figure 4A:
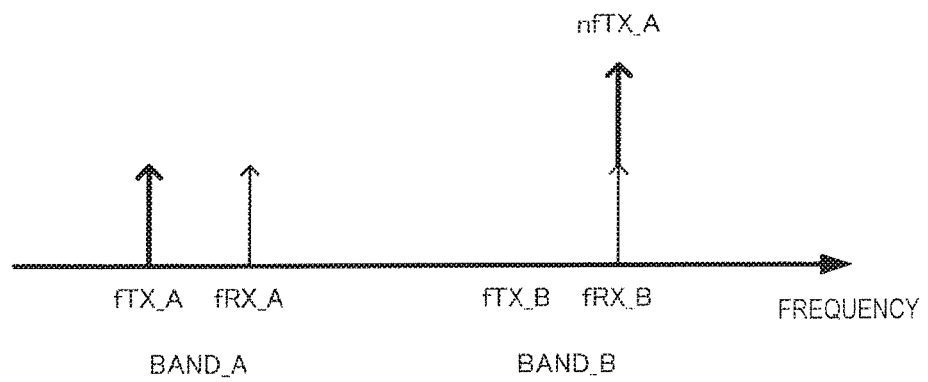
FIG. 4A illustrates an example of a situation in which signal interference occurs in DLCA.

FIG. 4A illustrates an example of a situation in which signal interference occurs in DLCA. In the example illustrated in FIG. 4A, two frequency bands BAND_A and BAND_B are used. The lower frequency band BAND_A is used in uplink. Here, fTX_A denotes a transmission frequency in the frequency band BAND_A, fRX-A denotes a reception frequency in the frequency band BAND_A and fRX_B denotes a reception frequency in the frequency band BAND_B.

In the example illustrated in FIG. 4A, if an integer multiple of the transmission frequency (nfTX_A) is substantially equal to the reception frequency (fRX_B) in the frequency band BAND_B, the reception signal will experience interference from a harmonic signal and the reception signal sensitivity will be reduced.

Figure 4B:
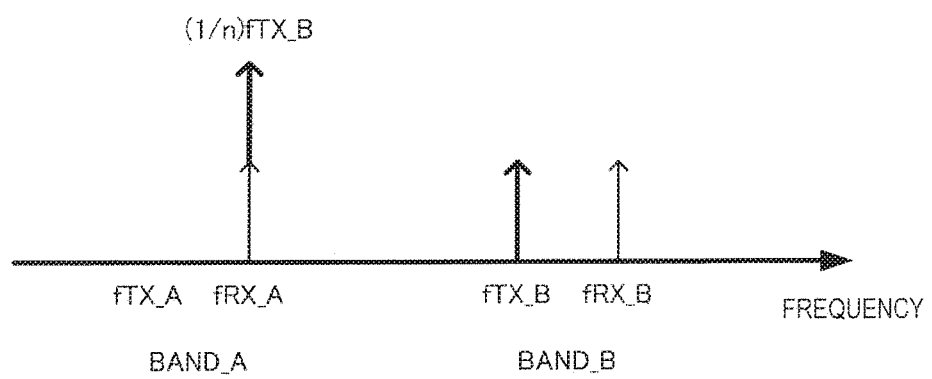
FIG. 4B illustrates another example of a situation in which signal interference occurs in DLCA.

FIG. 4B illustrates another example of a situation in which signal interference occurs in DLCA. In the example illustrated in FIG. 4B, two frequency bands BAND_A and BAND_B are used. The higher frequency band BAND_B is used in uplink. Here, fRX_A denotes a reception frequency in the frequency band BAND_A, fTX-B denotes a transmission frequency in the frequency band BAND_B and fRX_B denotes a reception frequency in the frequency band BAND_B.

In the example illustrated in FIG. 4B, if the reciprocal of an integer multiple of the transmission frequency ((1/n) fTX_A) is substantially equal to the reception frequency (fRX_A) in the frequency band BAND_A, the reception signal will experience interference from the transmission signal and the reception signal sensitivity will be reduced.

Description will be given of the mechanism behind the reduction in the reception signal sensitivity in the example illustrated in FIG. 4B. A direct conversion method, which is suitable for integration, is currently applied to the reception circuits of cellular phones. In this method, the center frequency of a reception signal and a local oscillation frequency applied to a mixer are the same. In order to provide an adequate signal-to-noise ratio, a large signal is used as the local oscillation signal and the local oscillation signal has a large harmonic component. In the example illustrated in FIG. 4B, the harmonic frequency is n times the reception frequency (fRX_A). If an input signal of this harmonic frequency is applied to the reception circuit, the input signal will undergo frequency conversion by a harmonic of the local oscillation signal and become an in-band interference wave. Thus, the reception signal sensitivity will be reduced. As illustrated in FIGS. 4A and 4B, in the case where DLCA is performed, when a specific relationship holds true between the two frequency bands, the reception signal experiences interference from the transmission signal and the reception sensitivity is reduced.

FIG. 5 lists the combinations of frequency bands having this specific relationship. In FIG. 5, "band (DLCA)" indicates the frequency bands used in DLCA. In addition, "UL" indicates the frequency band of the transmission signal in the case where DLCA is performed. "Affected DL" indicates the frequency band of a reception signal that experiences interference from a transmission signal in the case where the transmission signal is transmitted in the frequency band indicated by "UL". For example, if the frequency band of the transmission signal is band 6 (LB) in the case where frequency bands used in DLCA are band 6 and band 7, the reception signal of band 7 (VHB) is affected. Looking at FIG. 5, the combinations of frequency bands having the specific relationship are LB and VHB or LB and HB. In contrast, the specific relationship does not occur for a combination of HB and VHB.

Next, the effect of coupling between terminals of a power amplification module in the case where DLCA is performed will be described.

FIG. 6 illustrates an example configuration of a transmission unit for explaining the effect of coupling between terminals of a power amplification module. The transmission unit illustrated in FIG. 6 includes a power amplification module 600, duplexers 300, a switch circuit 310, a low pass filter (LPF) 620, a diplexer 320, an antenna 160 and a reception circuit 630.

The power amplification module 600 is an integrated circuit that includes power amplifiers 610, 611, 612 and 613. The power amplifiers 610, 611, 612 and 613 support band 17, GSM LB, GSM HB and band 4, respectively. The power amplification module 600 is to be used for descriptive purposes and is different from the power amplification modules 130 and 140 of this embodiment.

The duplexers 300 include band pass filters (BPFs) and low pass filters (LPFs) that support band 17, GSM LB, GSM HB and band 4.

The switch circuit 310 includes switches for switching signal paths between the duplexer 300 and the diplexer 320.

The low pass filter (LPF) 620 is provided between the switch circuit 310 and the diplexer 320 as a band 17 filter.

The reception circuit 630 is a reception circuit for band 4. The reception circuits for other frequency bands are not illustrated in FIG. 6 in order to simplify the illustration.

The effect of coupling between terminals of the power amplification module 600 will be described for the case where DLCA is performed using band 17 and band 4 and the frequency band of the transmission signal is band 17 in the configuration illustrated in FIG. 6. A frequency that is three times the frequency of the transmission signal of band 17 is substantially equal to the frequency of the reception signal of band 4.

The level of a harmonic signal having a frequency that is three times the frequency of the transmission signal of band 17 is −20 dBm at the output terminal of the power amplifier 610 for band 17. In addition, the out-of-band suppression of the band pass filters (BPFs) of the duplexers 300 is −30 dB, the out-of-band suppression of the low pass filters (LPFs) of the duplexers 300 is −20 dB, the attenuation of the low pass filter (LPF) 620 for band 17 is −30 dB, the out-of-band attenuation of the diplexer 320 is −30 dB, the attenuation when the switches of the switch circuit 310 are on is 0 dB, the attenuation when the switches are off is −20 dB and the attenuation caused by signal transmission between terminals of the power amplification module 600 is −30 dB.

Under these assumptions, the effect of a band 17 transmission signal of on the reception circuit 630 will be described.

First, a signal path A illustrated in FIG. 6 will be considered. A harmonic signal is attenuated by −30 dB by the band pass filter (BPF) for band 17 transmission. Next, the harmonic signal passes through a switch that is in an on state without being attenuated and is then attenuated by −30 dB by the low pass filter (LPF) for band 17. Then, the harmonic signal is further attenuated by −30 dB by the diplexer 320. Since the switch for band 4 is on, the harmonic signal passes through the switch with an attenuation of 0 dB. Then, since the frequency of the harmonic signal is inside the band 4 reception band, the harmonic signal passes through the band 4 reception band pass filter (BPF) with an attenuation of 0 dB. As a result, the harmonic signal that has passed along the signal path A acts as an in-band interference signal of −110 dBm at the input of the band 4 reception circuit 630.

Next, a signal path B illustrated in FIG. 6 will be considered. A harmonic signal of the band 17 transmission signal is transmitted to the output terminal of the GSM LB power amplifier 611 with an attenuation of −30 dB. The harmonic signal is attenuated by −20 dB by the GSM LB transmission low pass filter (LPF). Next, the harmonic signal is attenuated by −20 dB by the switch that is in an off state. Then, the harmonic signal is further attenuated by −30 dB by the diplexer 320. Since the switch for band 4 is on, the harmonic signal is not attenuated by the switch. Then, since the frequency of the harmonic signal is inside the band 4 reception band, the harmonic signal is not attenuated by the band 4 reception band pass filter (BPF). As a result, the harmonic signal that has passed along the signal path B acts as an in-band interference signal of −110 dBm at the input of the band 4 reception circuit 630.

Next, a signal path C illustrated in FIG. 6 will be considered. A harmonic signal of the band 17 transmission signal is transmitted to the output terminal of the GSM HB power amplifier 612 with an attenuation of −30 dB. The harmonic signal has a frequency inside the GSM HB and therefore is not attenuated by the GSM HB transmission low pass filter (LPF). Next, the harmonic signal is attenuated by −20 dB by the switch that is in an off state. The harmonic signal does not pass through the diplexer 320 and passes through the band 4 switch without being attenuated. Then, since the frequency of the harmonic signal is inside the band 4 reception band, the harmonic signal is not attenuated by the band 4 reception band pass filter (BPF). As a result, the harmonic signal that has passed along the signal path C acts as an in-band interference signal of −70 dBm at the input of the band 4 reception circuit 630.

Finally, a signal path D illustrated in FIG. 6 will be considered. A harmonic signal of the band 17 transmission signal is transmitted to the output terminal of the band 4 power amplifier 613 with an attenuation of −30 dB. The harmonic signal is attenuated by −30 dB by the band pass filter (BPF) for band 4 transmission. Then, the harmonic signal passes through the band 4 reception band pass filter (BPF) without being attenuated since the frequency of the harmonic signal is inside the band and the harmonic signal does not pass through the band 4 switch. As a result, the harmonic signal that has passed along the signal path D acts an in-band interference signal of −80 dBm at the input of the band 4 reception circuit 630.

According to the results illustrated in FIG. 6, the output terminal of the GSM HB power amplifier 612 and the output terminal of the band 4 (HB) power amplifier 613 are highly sensitive to coupling with the output terminal of the band 17 (LB) power amplifier 610. Therefore, it is highly necessary that isolation from the 3G/4G LB power amplifier be strengthened for the GSM HB power amplifier and the 3G/4G HB power amplifier.

FIG. 7 illustrates another example configuration of a transmission unit for explaining the effect of coupling between terminals of a power amplification module. The transmission unit illustrated in FIG. 7 includes a power amplification module 700, duplexers 300, a switch circuit 310, a low pass filter (LPF) 720, a diplexer 320, an antenna 160 and a reception circuit 730.

The power amplification module 700 is an integrated circuit that includes power amplifiers 710, 711, 712 and 713. The power amplifiers 710, 711, 712 and 713 support band 4, GSM HB, GSM LB and band 5, respectively. The power amplification module 700 is to be used for descriptive purposes and is different from the power amplification modules 130 and 140 of this embodiment.

The low pass filter (LPF) 720 is provided between the switch circuit 310 and the diplexer 320 as a band 5 filter.

The reception circuit 730 is a band 5 reception circuit. The reception circuits of other frequency bands are not illustrated in FIG. 7 in order to simplify the illustration.

The effect of coupling between terminals of the power amplification module 700 will be described for the case where DLCA is performed using band 4 and band 5 and the transmission signal frequency band is band 4 in the configuration illustrated in FIG. 7. A frequency that is half the frequency of the transmission signal of band 4 is substantially equal to the frequency of the reception signal of band 5. In other words, a frequency that is two times that of the reception signal of band 5 is inside the transmission frequency band of band 4. Therefore, the transmission signal of band 4 and a harmonic having a frequency that is two times that of a local oscillation signal used for band 5 reception interact with each other and form an in-band interference wave for the band 5 reception signal.

Here, the level of the transmission signal of band 4 is 28 dBm at the output terminal of the band 4 power amplifier 710. In addition, the out-of-band suppression of the band pass filters (BPFs) of the duplexers 300 is −30 dB, the out-of-band suppression of the low pass filters (LPFs) of the duplexers 300 is −20 dB, the attenuation of the low pass filter (LPF) 720 for band 5 is −30 dB, the out-of-band attenuation of the diplexer 320 is −30 dB, the attenuation when the switches of the switch circuit 310 are on is 0 dB, the attenuation when the switches are off is −20 dB and the attenuation caused by signal transmission between terminals of the power amplification module 700 is −30 dB.

Under these assumptions, the effect of a band 4 transmission signal on the reception circuit 730 will be described.

First, a signal path A illustrated in FIG. 7 will be considered. The transmission signal passes through the band 4 transmission band pass filter (BPF) and the switch with an attenuation of 0 dB. Next, the transmission signal is attenuated by −30 dB by the diplexer 320. Then, the transmission signal is attenuated by −30 dB by the band 5 low pass filter (LPF) 720. Since the switch for band 5 is on, the transmission signal passes through the switch with an attenuation of 0 dB. In addition, the transmission signal is attenuated by −30 dB by the band 5 reception band pass filter (BPF). Thus, the transmission signal that has passed along the signal path A acts as an in-band interference signal of −62 dBm at the input of the band 5 reception circuit 730.

Next, a signal path B illustrated in FIG. 7 will be considered. The band 4 transmission signal is transmitted to the output terminal of the GSM HB power amplifier 711 with an attenuation of −30 dB. The frequency of the transmission signal is inside the band of the GSM HB transmission low pass filter (LPF). Consequently, the transmission signal passes through the GSM HB transmission low pass filter (LPF) with an attenuation of 0 dB. Next, the transmission signal is attenuated by −20 dB by the switch that is in an off state. In addition, the transmission signal is attenuated by −30 dB by the diplexer 320. Then, the transmission signal is attenuated by −30 dB by the band 5 low pass filter (LPF) 720. Since the switch for band 5 is on, the transmission signal passes through the switch with an attenuation of 0 dB. In addition, the transmission signal is attenuated by −30 dB by the band 5 reception band pass filter (BPF). Thus, the transmission signal that has passed along the signal path B acts an in-band interference signal of −112 dBm at the input of the band 5 reception circuit 730.

Next, a signal path C illustrated in FIG. 7 will be considered. The band 4 transmission signal is transmitted to the output terminal of the GSM LB power amplifier 712 with an attenuation of −30 dB. The transmission signal is attenuated by −20 dB by the GSM LB transmission low pass filter (LPF). Next, the transmission signal is attenuated by −20 dB by the switch that is in an off state. Then, the transmission signal is attenuated by −30 dB by the band 5 reception band pass filter (BPF) 720 and does not pass though the diplexer 320. Since the switch for band 5 is on, the transmission signal passes through the switch with an attenuation of 0 dB. In addition, the transmission signal is attenuated by −30 dB by the band 5 reception band pass filter (BPF). Thus, the transmission signal that has passed along the signal path C acts as an in-band interference signal of −102 dBm at the input of the band 5 reception circuit 730.

Finally, a signal path D illustrated in FIG. 7 will be considered. The band 4 transmission signal is transmitted to the output terminal of the band 5 power amplifier 713 with an attenuation of −30 dB. The transmission signal is attenuated by −30 dB by the band 5 transmission band pass filter (BPF). Then, the transmission signal is attenuated by −30 dB by the band 5 reception band pass filter (BPF) and does not pass though the band 5 switch. Thus, the transmission signal that has passed along the signal path D acts as an in-band interference signal of −62 dBm at the input of the band 5 reception circuit 730.

According to the results illustrated in FIG. 7, the output terminal of the band 5 (LB) power amplifier 713 is highly sensitive to coupling with the output terminal of the band 4 (HB) power amplifier 710. Therefore, it is necessary that the characteristics of isolation from the 3G/4G HB power amplifier be improved for the 3G/4G LB power amplifier.

On the other hand, the effect of coupling of the band (HB) output terminal and the GSM HB or GSM LB output terminal (path B or path C) is small compared with the effect from the band 4 transmission signal path (path A). Therefore, the necessity of strengthening the isolation of the 3G/4G HB power amplifier, the GSM HB power amplifier and the GSM LB power amplifier is comparatively low.

The descriptions of FIG. 4A, FIG. 4B, FIG. 5, FIG. 6 and FIG. 7 are summarized hereafter.

First, as illustrated in FIG. 5, a combination of frequency bands having a possibility of the reception signal affected by DLCA is LB and VHB or LB and HB. Therefore, for example, a configuration can be considered in which a 3G/4G VHB power amplifier, a 3G/4G HB power amplifier and a GSM HB power amplifier form one power amplification module and a 3G/4G LB power amplifier and a GSM LB power amplifier form another power amplification module.

Next, as illustrated in FIG. 6, it is preferable that the GSM HB power amplifier and the 3G/4G LB power amplifier be provided in separate modules in order to strengthen their isolation from each other.

In addition, as illustrated in FIG. 7, it is preferable that the 3G/4G HB power amplifier and the 3G/4G LB power amplifier be provided in separate modules in order to strengthen their isolation from each other. The necessity of strengthening the isolation of the 3G/4G HB power amplifier, the GSM HB power amplifier and the GSM LB power amplifier is comparatively low.

Taking the above into consideration, in this embodiment, as illustrated in FIG. 2, the 3G/4G VHB power amplifier 200A, the 3G/4G HB power amplifier 200B, the GSM HB power amplifier 200C and the GSM LB power amplifier 200D are provided as one power amplification module 130, and the 3G/4G LB power amplifier 140 is provided as another power amplification module 140.

If we were to consider only the strengthening of isolation, it would be preferable to mount the GSM LB power amplifier 200D in the power amplification module 140 rather than in the power amplification module 130. However, if the GSM LB power amplifier 200D were mounted in the power amplification module 140, a circuit similar to the bias current converting circuit 231 would be required in the power amplification module 140 as well in order to generate a GSM bias current. Consequently, if the GSM LB power amplifier 200D were mounted in the power amplification module 140, the circuit scale of the entire communication unit 100 would be increased. As illustrated in FIG. 7, the necessity of strengthening isolation is comparatively low for the GSM LB power amplifier 200D. Therefore, by adopting the configuration described in this embodiment, as well as it being possible to suppress a reduction in reception sensitivity that occurs when DLCA is performed, it is also possible to suppress an increase in circuit scale. Thus, it is possible to provide the multi-mode multi-band communication unit 100 that is suitable for DLCA.

In addition, in the power amplification module 130, a TDD B40/B41 transmission signal can be amplified by the 3G/4G VHB power amplifier 200A. Furthermore, in the power amplification module 130, the path of a TDD B40/B41 transmission/reception signal can be switched by the switch circuit 220A. Thus, a TDD operation can be integrated into the power amplification module 130 and control of the communication unit 100 can be simplified.

Similarly, in the power amplification module 130, a TDD B34/B39 transmission signal can be amplified by the 3G/4G HB power amplifier 200B. Furthermore, in the power amplification module 130, the path of a TDD B34/B39 transmission/reception signal can be switched by the switch circuit 220B. Thus, a TDD operation can be integrated into the power amplification module 130 and control of the communication unit 100 can be simplified.

The power amplification module 130 may have a configuration that does not support TDD. In addition, the configuration of the input/output terminals of the power amplification modules 130 and 140 is not limited to that described above. For example, signals input from the power amplification module 130 may be supplied to a power amplifier inside the power amplification module 140 via an output terminal of the power amplification module 130 and an input terminal of power amplification module 140. Similarly, signals input from the power amplification module 140 may be supplied to a power amplifier inside the power amplification module 130 via an output terminal of the power amplification module 140 and an input terminal of power amplification module 130.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design modifications made to the embodiments by one skilled in the art are included in the scope of the present disclosure so long as the modifications have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A communication unit comprising:
   first and second power amplification modules, each of the first and second power amplification modules being integrated so as to be separate from each other;
   wherein the first power amplification module includes
      a first power amplifier amplifying a first transmission signal of a first frequency band in a first communication scheme,
      a second power amplifier amplifying a second transmission signal of a second frequency band in the first communication scheme, wherein the second frequency band is lower than the first frequency band,
      a third power amplifier amplifying a third transmission signal of a third frequency band in a second communication scheme, a fourth power amplifier amplifying a fourth transmission signal of a fourth frequency band in the second communication scheme, wherein the fourth frequency band is lower than the third frequency band,
a first bias current generating circuit generating a first bias current supplied to the first and second power amplifiers, and
a bias current converting circuit converting the first bias current into a second bias current supplied to the third and fourth power amplifiers, the second power amplification module includes
a fifth power amplifier amplifying a fifth transmission signal of a fifth frequency band in the first communication scheme, wherein the fifth frequency band is lower than the second frequency band, and
a second bias current generating circuit generating a third bias current supplied to the fifth power amplifier, and
an integer multiple of a transmission frequency in the fifth frequency band is substantially equal to a reception frequency in any of the first to third frequency bands, or a reciprocal of an integer multiple of a transmission frequency in any of the first to third frequency bands is substantially equal to a reception frequency in the fifth frequency band.

2. The communication unit according to claim 1,
wherein the first power amplifier is configured to amplify a sixth transmission signal of the first frequency band in a time division duplexing communication scheme, and
the first power amplification module further includes
a first transmission/reception terminal, wherein the amplified sixth transmission signal is output from the first transmission/reception terminal or a first reception signal of the first frequency band in the time division duplexing communication scheme is input to the first transmission/reception terminal,
a first output terminal for outputting the first reception signal input from the first transmission/reception terminal to a first reception circuit, and
a first switch circuit connecting the first transmission/reception terminal to an output of the first power amplifier or to the first output terminal.

3. The communication unit according to claim 2, wherein the communication unit supports down-link carrier aggregation.

4. The communication unit according to claim 2,
wherein the first power amplification module amplifies RF signals of a 3G/4G 2.5 GHz band, a 3G/4G 2 GHz band, a 2G 2 GHz band and a 2G 1 GHz band, and
wherein the second power amplification module amplifies RF signals of a 3G/4G 1 GHz band.

5. The communication unit according to claim 2,
wherein the second power amplifier is configured to amplify a seventh transmission signal of the second frequency band in the time division duplexing communication scheme, and
the first power amplification module further includes
a second transmission/reception terminal, wherein the amplified seventh transmission signal is output from the second transmission/reception terminal or a second reception signal of the second frequency band in the time division duplexing communication scheme is input to the second transmission/reception terminal,
a second output terminal for outputting the second reception signal input from the second transmission/reception terminal to a second reception circuit, and
a second switch circuit connecting the second transmission/reception terminal to an output of the second power amplifier or to the second output terminal.

6. The communication unit according to claim 5, wherein the communication unit supports down-link carrier aggregation.

7. The communication unit according to claim 5,
wherein the first power amplification module amplifies RF signals of a 3G/4G 2.5 GHz band, a 3G/4G 2 GHz band, a 2G 2 GHz band and a 2G 1 GHz band, and
wherein the second power amplification module amplifies RF signals of a 3G/4G 1 GHz band.

8. The communication unit according to claim 1,
wherein the second power amplifier is configured to amplify a seventh transmission signal of the second frequency band in the time division duplexing communication scheme, and
the first power amplification module further includes
a second transmission/reception terminal, wherein the amplified seventh transmission signal is output from the second transmission/reception terminal or a second reception signal of the second frequency band in the time division duplexing communication scheme is input to the second transmission/reception terminal,
a second output terminal for outputting the second reception signal input from the second transmission/reception terminal to a second reception circuit, and
a second switch circuit connecting the second transmission/reception terminal to an output of the second power amplifier or to the second output terminal.

9. The communication unit according to claim 8, wherein the communication unit supports down-link carrier aggregation.

10. The communication unit according to claim 8,
wherein the first power amplification module amplifies RF signals of a 3G/4G 2.5 GHz band, a 3G/4G 2 GHz band, a 2G 2 GHz band and a 2G 1 GHz band, and
wherein the second power amplification module amplifies RF signals of a 3G/4G 1 GHz band.

11. The communication unit according to claim 1, wherein the communication unit supports down-link carrier aggregation.

12. The communication unit according to claim 1,
wherein the first power amplification module amplifies RF signals of a 3G/4G 2.5 GHz band, a 3G/4G 2 GHz band, a 2G 2 GHz band and a 2G 1 GHz band, and
wherein the second power amplification module amplifies RF signals of a 3G/4G 1 GHz band.

* * * * *

UNITED STATES PATENT AND TRADEMARK OFFICE
CERTIFICATE OF CORRECTION

PATENT NO.       : 9,918,289 B2
APPLICATION NO.  : 15/451490
DATED            : March 13, 2018
INVENTOR(S)      : Satoshi Tanaka et al.

It is certified that error appears in the above-identified patent and that said Letters Patent is hereby corrected as shown below:

In the Specification

Column 11, Line 7, "(HB)" should be -- 4 (HB) --.

Signed and Sealed this
Nineteenth Day of June, 2018

Andrei Iancu
*Director of the United States Patent and Trademark Office*